(12) United States Patent
Telefus

(10) Patent No.: US 11,870,364 B2
(45) Date of Patent: Jan. 9, 2024

(54) TWO-WIRE ELECTRONIC SWITCH AND DIMMER

(71) Applicant: AMBER SOLUTIONS, INC., Dublin, CA (US)

(72) Inventor: Mark Telefus, Orinda, CA (US)

(*) Notice: Subject to any disclaimer, the term of this patent is extended or adjusted under 35 U.S.C. 154(b) by 272 days.

(21) Appl. No.: 17/596,415

(22) PCT Filed: Aug. 5, 2020

(86) PCT No.: PCT/US2020/044930
§ 371 (c)(1),
(2) Date: Dec. 9, 2021

(87) PCT Pub. No.: WO2022/031276
PCT Pub. Date: Feb. 10, 2022

(65) Prior Publication Data
US 2022/0311350 A1    Sep. 29, 2022

Related U.S. Application Data

(60) Provisional application No. 63/016,956, filed on Apr. 28, 2020.

(51) Int. Cl.
*H02M 3/335* (2006.01)
*H02M 7/217* (2006.01)
*H05B 45/50* (2022.01)
*H05B 45/10* (2020.01)
*H05B 45/3725* (2020.01)
*H02P 29/00* (2016.01)
*H02M 1/08* (2006.01)
*H02M 7/06* (2006.01)

(52) U.S. Cl.
CPC ............ *H02M 7/217* (2013.01); *H02M 1/08* (2013.01); *H02M 7/06* (2013.01); *H02P 29/00* (2013.01); *H05B 45/10* (2020.01); *H05B 45/3725* (2020.01); *H05B 45/50* (2020.01)

(58) Field of Classification Search
CPC .......... H02M 7/217; H02M 1/08; H02M 7/06; H02M 5/2932; H02M 1/0006; H02P 29/00; H02P 27/08; H03K 2217/0009; H03K 2217/0081; H03K 17/693
See application file for complete search history.

(56) References Cited

U.S. PATENT DOCUMENTS

| 4,823,225 | A * | 4/1989 | Foster | H02H 5/083 |
| | | | | 340/650 |
| 9,729,066 | B1 * | 8/2017 | Lu | H02M 1/14 |
| 2010/0270982 | A1 * | 10/2010 | Hausman, Jr. | H01H 47/22 |
| | | | | 320/166 |
| 2016/0301319 | A1 * | 10/2016 | Vermulst | H02M 3/33538 |

(Continued)

*Primary Examiner* — Muhammad S Islam
(74) *Attorney, Agent, or Firm* — Mark Wisnosky

(57) ABSTRACT

A bidirectional switch and dimmer for the control of power from an AC source to a load is described. The approach uses power MOSFETs in a bidirectional switch subcircuit configuration that includes a floating AC/DC power supply and a solid state double pole switch that alternates between connection of the AC source to the load and periodic connection of the AC source to the AC/DC power supply. The switch and dimmer circuit configuration allows insertion into an existing single-phase circuit using only two wires. The design allows for manufacturing the entire circuit on a single chip.

13 Claims, 14 Drawing Sheets

(56) References Cited

U.S. PATENT DOCUMENTS

2017/0110878 A1* 4/2017 Jacobson ................ H02M 3/04
2019/0312460 A1* 10/2019 Van Boheemen .. H02J 7/00034
2020/0014301 A1* 1/2020 Telefus ................ G11C 27/024
2021/0335563 A1* 10/2021 Guziak ................ G01L 5/1623

* cited by examiner

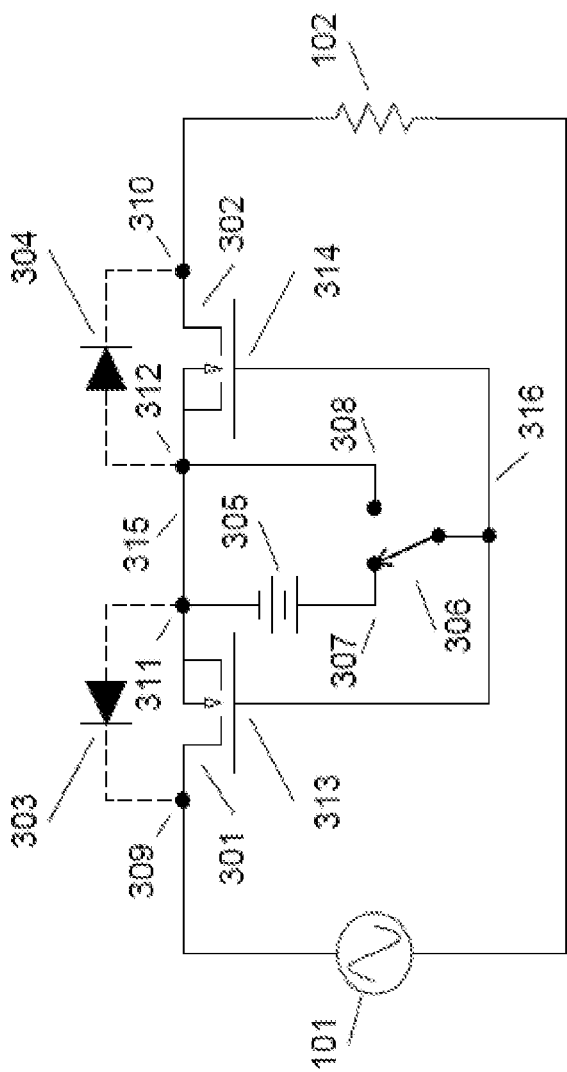

TWO-WIRE ELECTRONIC SWITCH AND DIMMER

CROSS-REFERENCE TO RELATED APPLICATIONS

Not applicable.

STATEMENT REGARDING FEDERALLY SPONSORED RESEARCH OR DEVELOPMENT

Not Applicable.

BACKGROUND OF THE INVENTION

Technical Field

The invention relates to a power management system and methods to provide an electronic switch and dimming control.

Related Background Art

Traditional access to alternating current (AC) electrical power in home and business environments is provided by mechanical outlets that are wired into the facility electrical system. These outlets are protected from excessive electrical loads or potentially dangerous ground faults using electromechanical devices such as fuses and circuit breakers. Similarly, the control of conventional electrical room appliances such as lighting and ceiling fans occurs using electromechanical switches. These fundamentally mechanical control devices provide simple on-off control and inevitably wear out and, over time, can cause short circuits or potentially dangerous arcing.

More nuanced control of common electrical appliances is typically provided by electronic devices such as triacs which allow the AC mains waveform to be interrupted on a cycle-by-cycle basis, so-called phase control. Although significantly more efficient than the rheostats or autotransformers that preceded them, triacs are still too inefficient to be used effectively in small enclosures for the control of large electrical loads and can induce electrical noise back into the facility electrical system. Furthermore, they can cause flickering in modern light-emitting diode (LED) lamps that are responsible for adverse health effects.

State-of-the-art AC switches employ high-voltage semiconductor devices such as bipolar transistors or MOSFETs to control the application of AC power to the desired loads. These modern circuits incorporate AC/DC power supplies and transistorized control circuits that require access to all three wires in a typical single-phase circuit: the hot lead from the AC mains, the lead to the switched load, and the common neutral lead. Examples of such state-of-the-art three-wire systems include international application publication WO 2019/133110, Electronic Switch and Dimmer, Telefus et al, filed 7 Nov. 2018.

There is a need for an improved electronic AC control system that provides a wider range of more reliable and highly efficient control options for broad application in facility electrical systems. Furthermore, there is a need for such a control system that can be realized using semiconductor devices that can be integrated with other circuitry for advanced power control functions that can be manufactured at low cost, and for a control system that can be simply installed using only two wires: the hot AC mains lead and the load.

BRIEF SUMMARY OF THE INVENTION

The present invention relates to a novel approach for the control of AC power throughout a facility electrical system ranging from simple outlet on-off switching to continuous variation of the applied AC power for, for example, the dimming of electrical lights. More particularly the invention relates to a combination of functions that provides in one embodiment both on-off and phase-control of the AC mains waveform.

One embodiment uses power MOS field-effect transistors (MOSFETs) as electronic switches having very low "on" resistance connected between the AC mains supply and the desired load. Since typical power MOSFETs intrinsically incorporate a body diode in parallel with the conducting channel, pairs of devices are connected in a back-to-back arrangement having the source terminals in common to provide a truly bidirectional (AC) switch configuration. In order to control the switching action of the power MOSFETs a novel floating AC/DC power supply is included that is periodically refreshed through operation of the MOSFET switches in synchronism with the AC mains waveform. The specific examples are not intended to limit the inventive concept to the example application. Other aspects and advantages of the invention will be apparent from the accompanying drawings and detailed description.

BRIEF DESCRIPTION OF THE DRAWINGS

FIG. 3A is a schematic diagram of the basic elements of the prior art bidirectional switch.

DETAILED DESCRIPTION OF THE INVENTION

Figure 1:
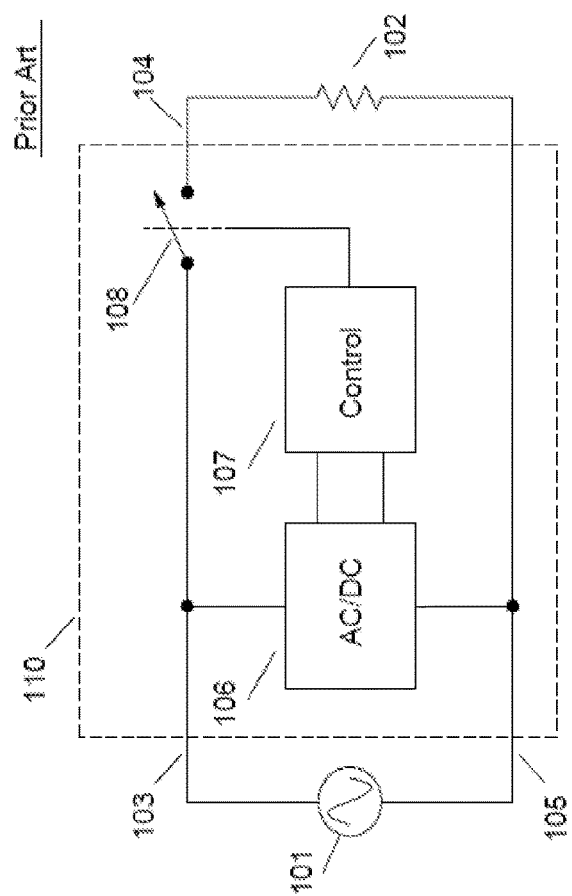
FIG. 1 is a block diagram of a basic prior art three-wire switch/dimmer circuit.

FIG. 1 is a block diagram of a basic prior art three-wire switch/dimmer unit 100 employing solid-state switch devices. AC mains source 101 provides hot 103 and neutral 105 input connections through switch/dimmer circuit 100 to load 102 connected to load 104 and neutral 105 output connections. Switch device 108 is driven by switch control circuit 107 which is provided with DC power by AC/DC power supply 106. In switch mode continuous DC bias is applied by the control circuit 107 to switch device 108 to maintain closure. In dimmer mode the operating bias is provided by the control circuit 107 as pulses that are synchronized with the AC mains 101 waveform wherein the duty cycle of the pulses establishes the percentage of total power applied to the load. For dimmer operation, the controller 107 comprises pulse generation circuitry and synchronization with the AC mains as is known in the art. The controller may also include the user interface to input desired power to the load. In one embodiment the user interface is physically incorporated into the control circuit 107. In another embodiment the control circuit includes wireless communication circuitry and the user interface is located physically remote from the control circuit 107. Note that a minimum of three connections (103-105) are required to install the switch/dimmer unit.

Figure 2:
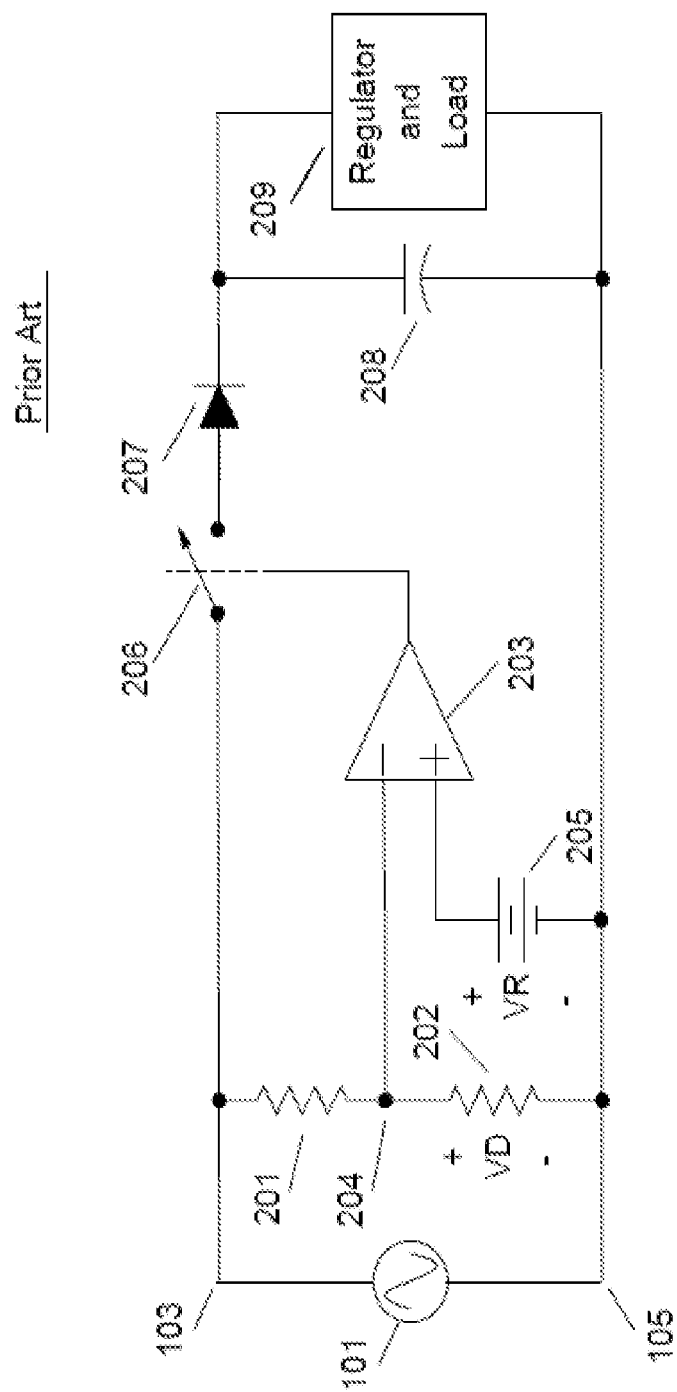
FIG. 2 is a schematic diagram of a prior art switched AC/DC power supply.

FIG. 2 is a schematic diagram of a prior art switched AC/DC power supply 106. The circuitry includes a voltage divider network 201, 202 having output node 204 and connected across the AC mains 101. Comparator circuit 203 has its inverting input connected to the voltage divider output node 204 and a voltage reference 205 having reference voltage $V_R$ connected to its non-inverting input, wherein the comparator 203 controls a series switch 206 that disconnects (opens switch 206) the hot input 103 from succeeding circuitry if the voltage divider output voltage $V_D$ exceeds the reference voltage $V_R$. When switch 206 is closed, capacitor 208 is charged through series diode 207. Diode 207 keeps capacitor 208 from discharging back through switch 206 when the voltage divider output voltage decreases. Thus, the combination of diode 207 and capacitor 208 form a "peak detector" circuit that stores energy in each one-half of an AC mains cycle to supply to subsequent regulator circuitry and to the load 209. The voltage across capacitor 208 need only be large enough to satisfy the energy requirement of the subsequent regulator circuitry and load 209. The input voltage to the subsequent regulator 209 is significantly reduced compared to the rms value of the AC mains. The operation of the "peak detector" circuit ensures the steady-state voltage stored on capacitor 208 is always $V_R$, regardless of fluctuations in the peak voltage of the AC mains, as long as the voltage at the voltage divider output 204 remains larger than $V_R$. This embodiment of a switching circuit operates as a voltage regulator circuit itself.

FIG. 3A is a schematic diagram of the basic elements of the prior art bidirectional switch 108 using power MOSFET devices to create a bidirectional electronic switch controlling the power delivered from AC source 101 to load 102. Power MOSFETs 301 and 302 include body diodes 303 and 304, respectively. Switch 306 controls the gate-to-source bias voltage applied to power MOSFETs 301 and 302. In the "on" 307 position bias voltage 305 is applied to the gate terminals 313, 314 of the power MOSFETs 301 and 302. Voltage 305 is a voltage greater than the threshold voltage of the power MOSFETs (typically 5 to 10 volts) causing an inversion layer to form thereby creating a conducting channel extending from the drain 309, 310 to the source 311, 312 of each device. In this "on" state, the drain-to-source behavior of each power MOSFET can be modeled as a low value resistor, $R_{ds}$. As long as the voltage drop between drain and source remains below about 0.6 volt, the body diodes remain nonconductive and can be neglected. In the "on" state the circuit of FIG. 3A is equivalently the load 102 connected to AC source 101 through a series resistor having value $2R_{ds}$.

In the "off" 308 position of switch 306 the gate terminals 313, 314 of the power MOSFETs 301, 302 are shorted to the source terminals 311, 312 and the drain-to-source conducting channels vanish as long as the drain-to-source voltage remains below the breakdown voltage of the body diodes. In the "off" state the circuit of FIG. 1 is equivalently the load 102 connected to AC source 101 through back-to-back body diodes 303 and 304, which effectively disconnects the load 102 from source 101.

The requirement that the drain-to-source voltage of the power MOSFETs remain below the breakdown voltage of the body diodes, $V_{br}$, in the "off" state requires that the breakdown voltage of the body diodes exceed the peak voltage of AC source 101. Thus, for example, assuming that source 101 corresponds to a common 120 volt (rms) AC mains, then the breakdown voltage of each body diode must exceed the peak source voltage of 170 volts.

A more detailed analysis of the power MOSFET structure shows that the body diode is effectively the base-collector junction of a bipolar transistor connected in parallel with the MOSFET channel. Additional parasitic elements include the capacitance of the base-collector junction and a parasitic resistance between the base and the emitter. This AC-coupled circuit places a constraint on the rate of change of the drain-to-source voltage, $dV_{ds}/dt$, to avoid forward biasing the base-emitter junction, thereby causing the bipolar transistor to conduct while the MOSFET channel is "off". While the resulting leakage current may not be sufficient to energize the load 102, it may be large enough to cause additional efficiency or safety concerns.

Similarly, consideration of the constraints in the "on" state require that the drain-to-source voltage drop for each power MOSFET given by $R_{ds}*Iload$ be less than about 0.6 volts. Potentially more important is the power dissipated in each power MOSFET in the "on" state given by $R_{ds}*Iload^2$ which must remain less than a few watts to avoid excessive temperature rise. Thus, for example, switching a common household circuit from a 120 volt AC mains having a typical limit of 20 amperes requires that $R_{ds}$ for each power MOSFET be less than 0.005 ohms (5 milliohms.)

It is well known in the art that the breakdown voltage of the body diode can be advantageously traded off against the value of $R_{ds}$ by varying the structure and the doping levels in the device. In particular, it has been shown that the value of $R_{ds}$ is proportional to $V_{br}^{2.5}$. Thus, for example, cutting $V_{br}$ in half results in reducing $R_{ds}$ by a factor of 5.7.

The circuit of FIG. 3A shows that the conceptual bias switching circuit, comprising switch 306 and voltage source 305, floats electrically with the common source terminals of the back-to-back power MOSFETs 301 and 302 which vary in voltage across the entire peak-to-peak range of source 101. Although simple in concept, this floating bias circuit can be difficult to realize in practice at low cost.

Figure 3B:
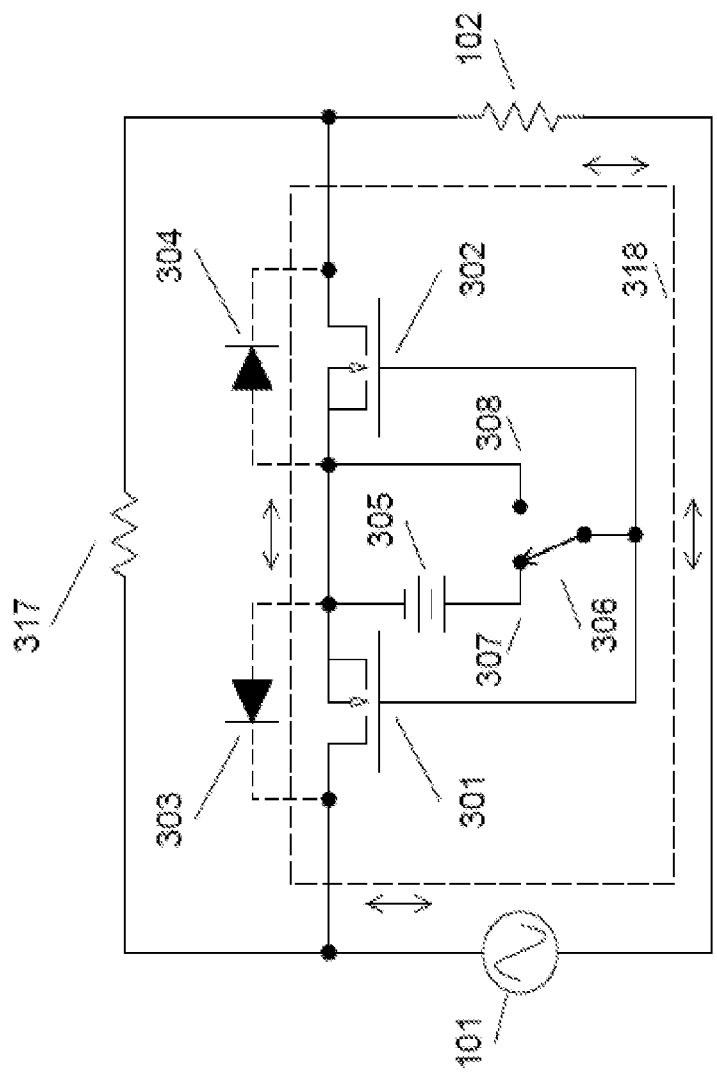
FIG. 3B is a modification of the circuit of FIG. 3A including an additional load across the switch devices.
Figure 3C:
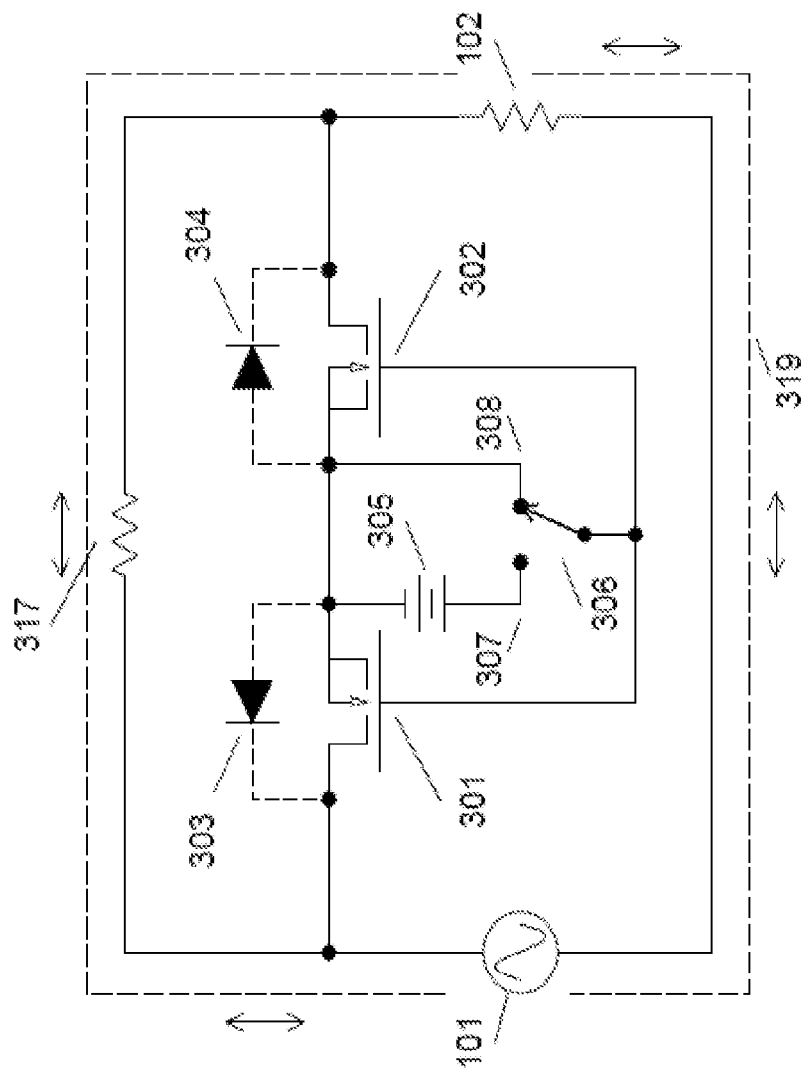
FIG. 3C is the circuit of FIG. 3B showing current through the additional load when the switch devices are "off."

FIG. 3B shows a modification of the circuit of FIG. 3A in which additional load device 317 is connected in parallel with power MOSFETs 301 and 302, with control switch 306 in the "on" position connecting the power MOSFET gates 313, 314 to voltage 305. Current flows from AC source 101 through the power MOSFET channels to load 102, effectively bypassing the additional load device 317 following the path 318. FIG. 3C shows the circuit of FIG. 3B when control switch 306 is moved to the "off" position, connecting the power MOSFET gate electrodes 313, 314 to the source terminals 311, 312. In this case the power MOSFET devices are nonconducting and current flows from AC source 101 through additional load 317. Current follows path 319 flowing through additional load 317 and load 102 and returning to AC source 101. Thus, the bidirectional switch circuit acts like a two-pole switch, supplying full current to the load 102 when the power MOSFETs are "on" and reduced power to the additional load 317 when the power MOSFETs are "off".

Figure 4:
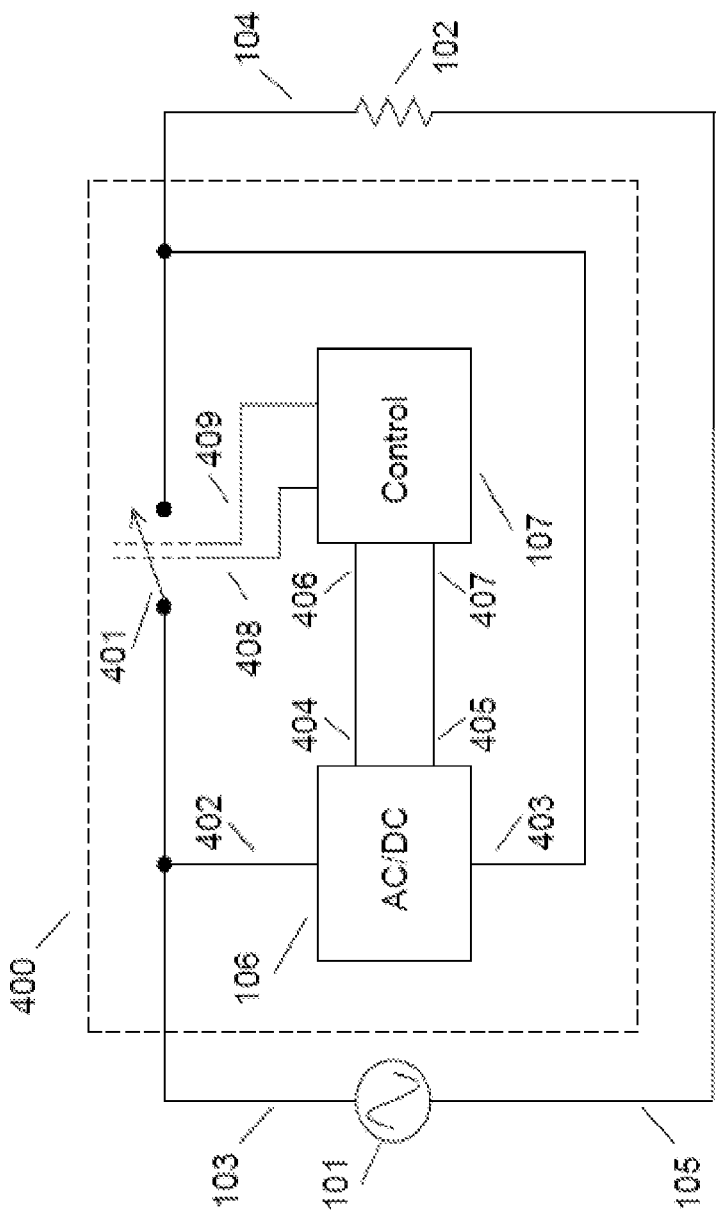
FIG. 4 is a block diagram of an embodiment of a two-wire switch/dimmer circuit.

FIG. 4 is a block diagram of an embodiment of a two-wire switch/dimmer 400. In contrast to FIG. 1, the electronic switch and dimmer 400 requires only two wires 103, 104 for connection and operation. The electronic switch element 401 directly connects the AC mains 101 to the load 102. AC power is provided to AC/DC converter 106 via supply lines 402, 403 and filtered and regulated DC power is supplied to subsequent circuitry via DC output lines 404, 405. Control circuit 107 is supplied with DC power via input lines 406, 407 and control signals for controlling the state of switch 401 is provided via control lines 408, 409. As in the circuit of FIG. 1, in dimmer mode the operating bias for switch 401 is provided by the control circuit 107 as pulses that are synchronized with the AC mains 101 waveform wherein the duty cycle of the pulses establishes the percentage of total power applied to the load. Continuous full power operation in switch mode requires that switch 401 be opened periodically to refresh the AC/DC power supply 106 which must incorporate sufficient energy storage to provide operating DC power between refresh operations.

Figure 5:
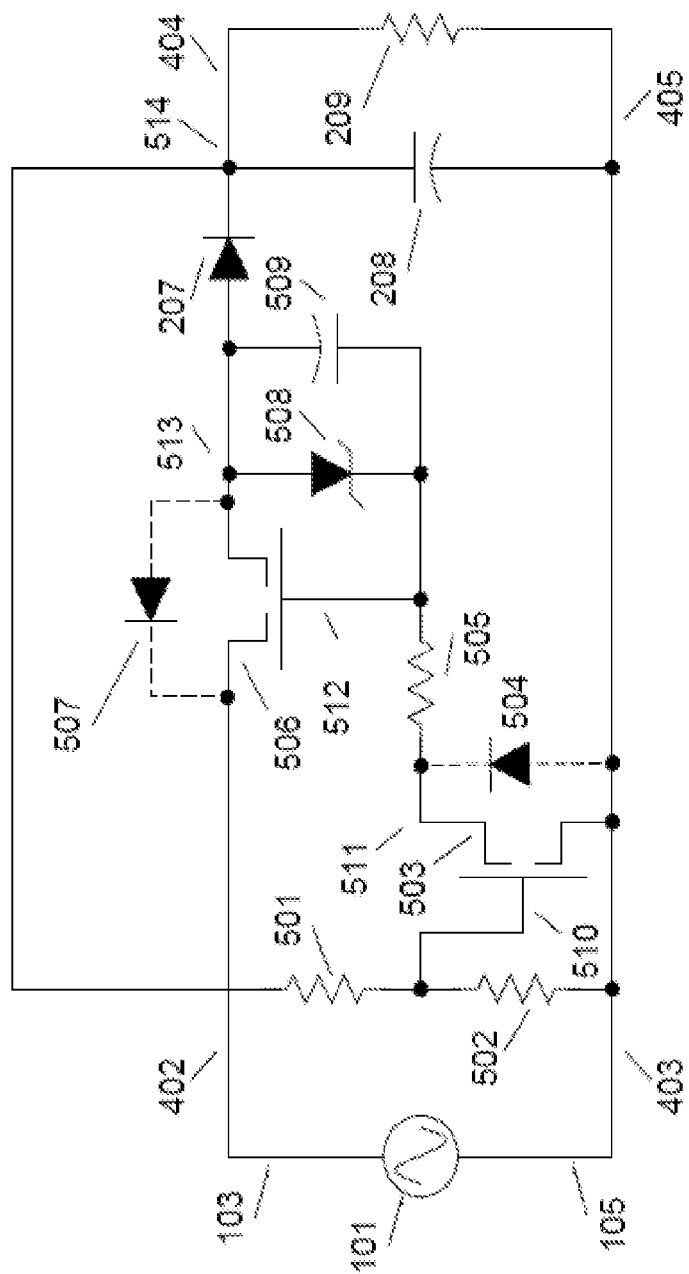
FIG. 5 is a schematic diagram of an embodiment of the AC/DC power supply of FIG. 2 using MOSFETs.

FIG. 5 is a schematic diagram of an embodiment of the AC/DC power supply of FIG. 2 using MOSFETs, one 503 having input/gate 510 and output 511 to form a simple comparator circuit (203 in FIG. 2) and one 506 having input/gate 512 and output 513 as a switch (206 in FIG. 2.) The input to the comparator is the gate 510 of MOSFET 503 and the analog of voltage reference 205 in FIG. 2 is the threshold voltage of MOSFET 503. Both MOSFETs 503 and 506 incorporate body diodes shown explicitly as 504 and 507, respectively. Rather than appearing across the AC mains 101, the voltage divider comprising resistors 501 and 502 effectively appears across the DC output node 514. Thus, MOSFET 503 turns on, thereby turning switch MOSFET 506 off, when the DC output 514 reaches a value determined by the threshold voltage of MOSFET 503 and the voltage divider ratio established by resistors 501 and 502. Note that the circuit operates as described when the hot lead 103 of AC mains 101 is positive with respect to the neutral lead 105. When the neutral lead 105 is positive with respect to the hot lead 103, current flows through body diode 504, current limiting resistor 505, the parallel network consisting of Zener diode 508 and capacitor 509, and back to AC mains 101 through body diode 507. This charges capacitor 509 to the Zener voltage which is selected to exceed the threshold voltage of switch MOSFET 506 sufficiently to ensure that it is fully on when the polarity of the AC mains 101 reverses. This circuit configuration significantly reduces the power dissipated in switch MOSFET 506 in its forward conduction mode, thereby significantly increasing the efficiency of the circuit.

Figure 6:
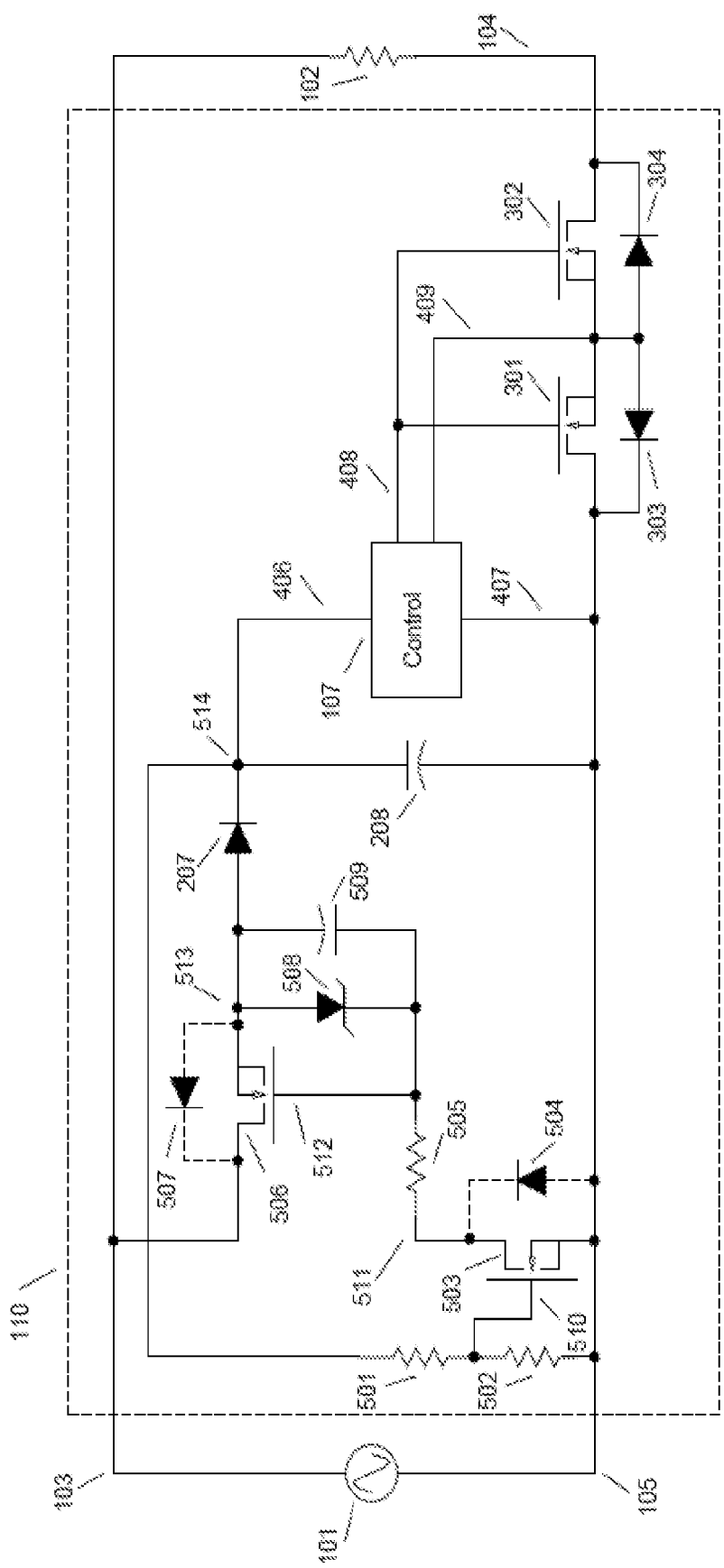
FIG. 6 is a schematic diagram of an embodiment of the three-wire circuit of FIG. 1 using the AC/DC power supply of FIG. 5 and a variation of the basic switch circuit of FIG. 3A.

FIG. 6 is a schematic diagram of an embodiment of the three-wire circuit 100 of FIG. 1 using the AC/DC power supply of FIG. 5 and a variation of the basic switch circuit of FIG. 3. The switch circuit comprises power MOSFETs 301 and 302, including body diodes 303 and 304, respectively and is relocated to the AC mains 101 neutral line 105 to allow for the control voltage levels provided by the AC/DC power supply. The function of switch 306 in FIG. 3 is accomplished directly using control circuit 107 which provides floating control outputs 408 and 409 and is powered by the AC/DC power supply circuit shown in FIG. 5.

Figure 7:
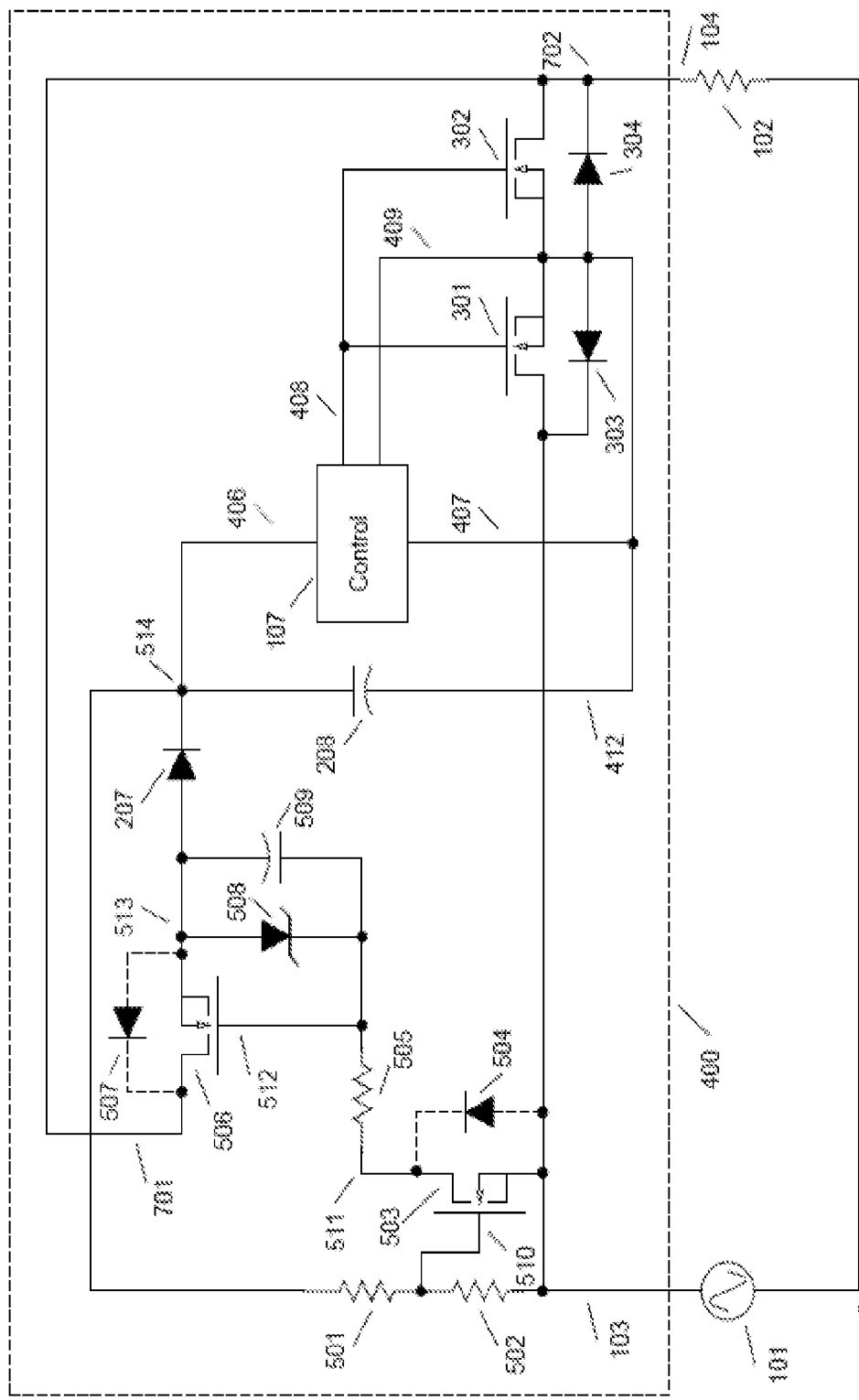
FIG. 7 is a schematic diagram of the embodiment of FIG. 6 wherein the elements have been reconnected to produce the two-wire circuit of FIG. 4.

FIG. 7 is a schematic diagram of the embodiment of FIG. 6 wherein the elements have been alternatively connected to produce the two-wire circuit 400 of FIG. 4. The new configuration primarily involves reconnecting the hot lead 103 of AC source 101 to what had formerly been the neutral line 105, reconnecting the load from what had formerly been the AC mains 101 hot lead 103 to the AC mains 101 neutral lead 105, reconnecting the drain 701 of MOSFET 506 from what had been AC mains 101 hot lead 103 to bidirectional switch output node 702, and separating the floating neutral 404 line having connections to capacitor 208, the control circuit 107, and the common source connections of the MOSFET switch devices 301 and 302, from what had been the AC mains 101 neutral line 105. As in FIG. 6, control circuit 107 provides floating control outputs 408 and 409. In summary, the bidirectional electronic switch system 400 for switching current in an alternating current (AC) circuit between an AC source 101 having first and second terminals and a load 102 having first and second terminals, and having an input terminal 103 connected to a first terminal of AC source 101 and an output terminal 104 connected to a first terminal of load 102, wherein second terminal of AC source 101 and second terminal of load 102 are interconnected external to the bidirectional switch system; further comprising:

a. an AC to DC conversion system 106 having first 402 and second 403 input terminals for providing energy from the AC source 101 in a direct current (DC) to first 404 and second 405 output terminals connected to a control circuit system 107, and b. the control circuit system 107 having first 406 and second 407 DC input terminals connected respectively to first 404 and second 405 outputs of said AC to DC conversion system 106; and first 408 and second 409 output terminals for providing control signals to an electronic switch 401, and c. an electronic switch 401 connected between the input terminal 103 and the bidirectional switch output terminal 104; wherein the state of the control signal appearing between control system output terminals 408, 409 determines the state of the switch.

Figure 8A:
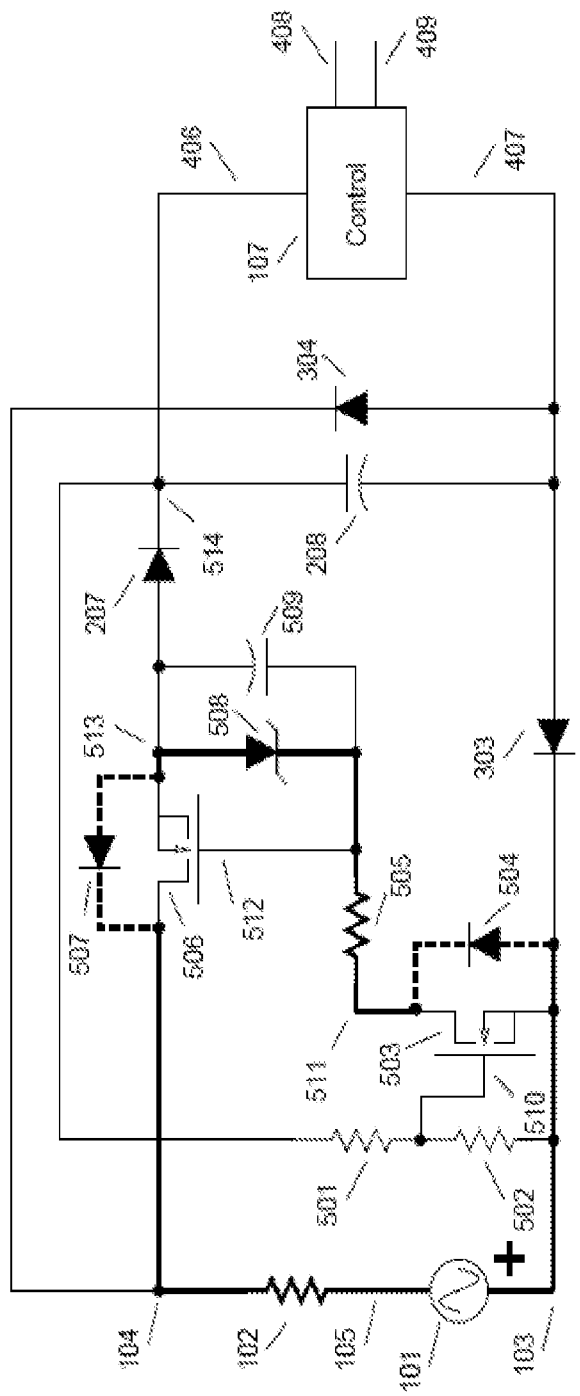
FIG. 8A shows effective configuration of the circuit of FIG. 7 when the MOSFETs in the bidirectional switch are "off" and the neutral line is positive with respect to the hot line.

FIG. 8A shows the effective configuration of the circuit of FIG. 7 when MOSFETs 301 and 302 in the bidirectional switch circuit are "off" and the AC mains 101 hot line 103 is positive with respect to the AC mains 101 neutral line 105. Current flows through body diode 504, current limiting resistor 505, the parallel network consisting of Zener diode 508 and capacitor 509, and back to AC mains 101 through body diode 507 and load 102. This charges capacitor 509 to the Zener voltage which is selected to exceed the threshold voltage of switch MOSFET 506 sufficiently to ensure that it is fully on when the polarity of the AC mains 101 reverses.

Figure 8B:
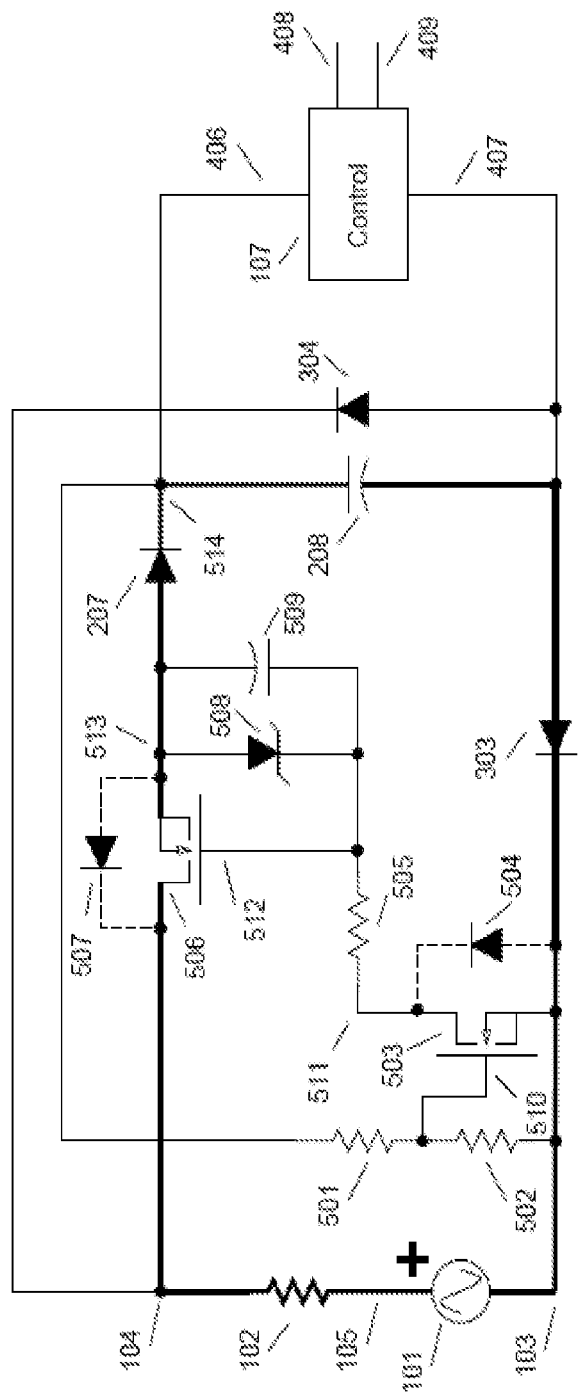
FIG. 8B shows effective configuration of the circuit of FIG. 7 when the MOSFETs in the bidirectional switch are "off" and the hot line is positive with respect to the neutral line.

FIG. 8B shows the effective configuration of the circuit of FIG. 7 when the MOSFETs in the bidirectional switch are "off" and the AC mains 101 neutral line 105 is positive with respect to the AC mains 101 hot line 103. Current flows through load 102, through the channel of MOSFET 506 and through peak detect diode 207, charging capacitor 208 to the voltage determined by the threshold voltage of MOSFET 503 and the voltage divider comprising resistors 501 and 502, returning to AC mains 101 through the forward biased body diode 303.

Figure 9:
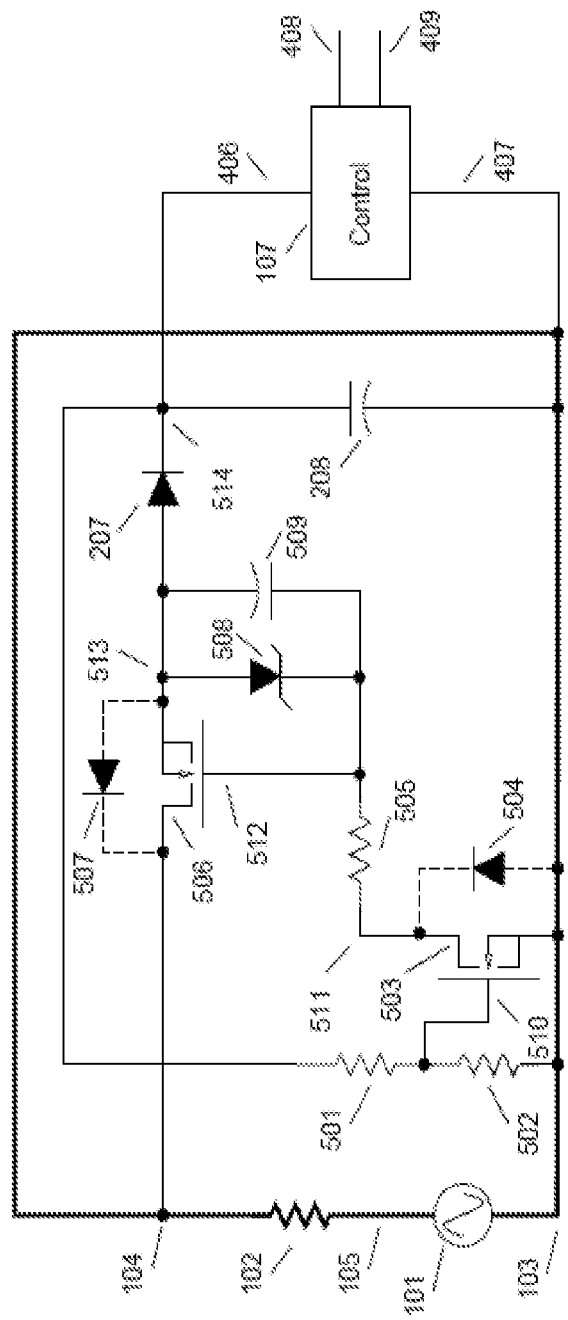
FIG. 9 shows effective configuration of the circuit of FIG. 7 when the MOSFETs in the bidirectional switch are "on".

FIG. 9 shows effective configuration of the circuit of FIG. 7 when the MOSFETs in the bidirectional switch are "on". The AC/DC power supply circuit is bypassed and all current flows from AC mains 101 through load 102.

Figure 10:
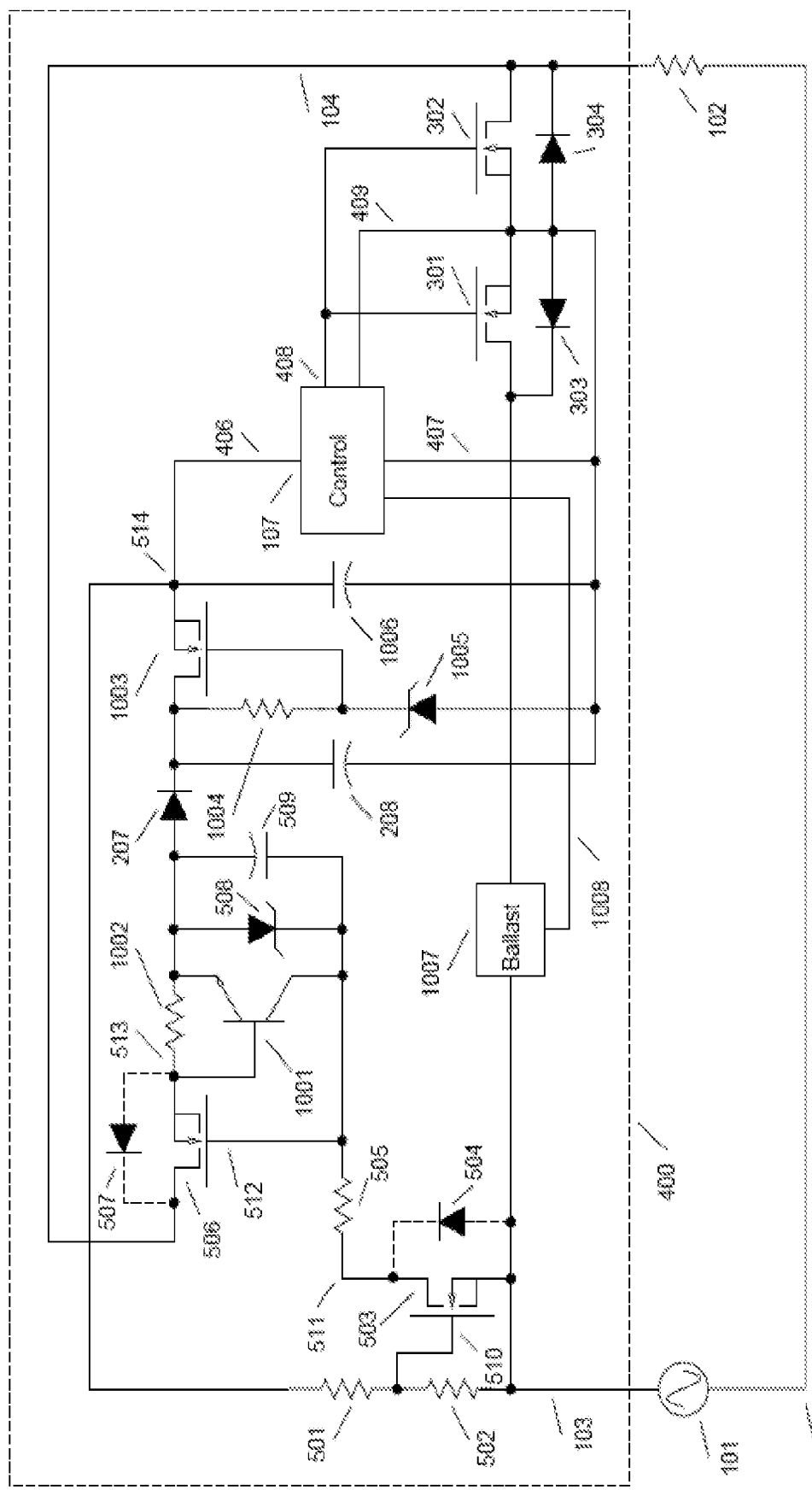
FIG. 10 shows the circuit of FIG. 7 with added subcircuits for overcurrent protection and for output DC voltage regulation.

FIG. 10 shows the circuit of FIG. 7 with added subcircuits for overcurrent protection, for output DC voltage regulation, and providing a ballast for LED lighting. Current sampling resistor 1002 and npn bipolar transistor 1001 form an overcurrent protection circuit. Resistor 1002 has a very small value (much less than one ohm) determined by the maximum current rating of power MOSFET 506. When the voltage drop across resistor 1002 exceeds approximately 0.6V (for silicon transistors) bipolar transistor 1001 conducts, connecting the gate of MOSFET 506 to its source and reducing the current. Series pass MOSFET 1003, bias resistor 1004, Zener diode 1005 and filter capacitor 1006 form a simple voltage regulation circuit. The output voltage 514 will be regulated to a value given by the Zener voltage of diode 1005 less the threshold voltage of pass MOSFET 1003. In one embodiment the two-wire switch further includes ballast circuit 1007 that provides additional control of load current. Circuit 1007 is connected in series with switches 301, 302. Ballast circuit 1007 is controlled by control circuit 107, and connected to switch control circuit 107 through 1008. Connection 1008 may be a wired or wireless connection to the control circuit 107.

Figure 11:
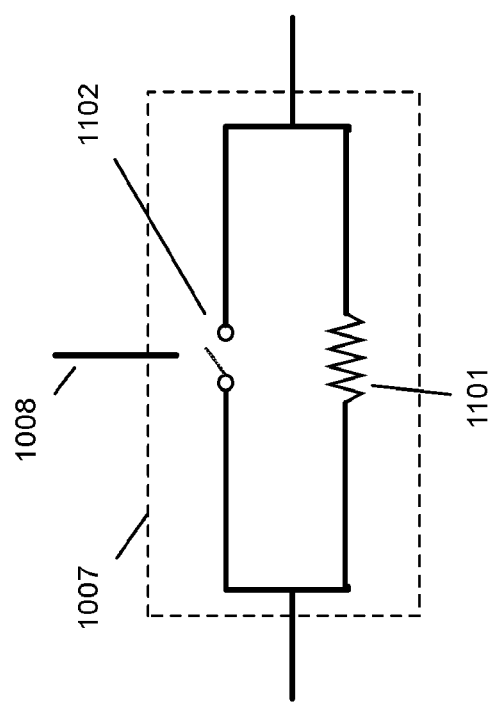
FIG. 11 shows details of a ballast circuit as used in FIG. 10.

In one embodiment, shown in FIG. 11, the ballast circuit 1007 includes a ballast resistor 1101 and switch 1102 wired in parallel. The switch 1102 is controlled through connection 1108 by control circuit 107. In one embodiment for dimming LED lighting the switch 1102 is normally closed, and, opened when dimming to 0% output such that ballast resistor 1101 reduces current through a connected LED load to less than a threshold required to light the LED. In one embodiment the switch 1102 is a relay switch. In another embodiment control line 1008 is a wireless connection to the control circuit 107.

SUMMARY

A bidirectional switch and dimmer for the control of power from an AC source to a load is described. The approach uses power MOSFETs in a bidirectional switch subcircuit configuration that includes a floating AC/DC power supply and a solid state double pole switch that alternates between connection of the AC source to the load and periodic connection of the AC source to the AC/DC power supply. The switch and dimmer circuit configuration allows insertion into an existing single-phase circuit using only two wires. The design allows for manufacturing the entire circuit on a single chip.

I claim:

1. A bidirectional electronic switch system (400) for switching current in an alternating current (AC) circuit between an AC source (101) having first and second terminals, and, a load (102) having first and second terminals, the bidirectional electronic switch system comprising:
   a. an input terminal (103) connected to a first terminal of AC source (101) and an output terminal (104) connected to a first terminal of load (102), and wherein second terminal (105) of AC source (101) and the second terminal of load (102) are interconnected external to the bidirectional switch system, and,
   b. an AC to DC conversion system (106) having first (402) and second (403) input terminals for providing energy from the AC source (101) in a direct current (DC) to first (404) and second (405) output terminals connected to a control circuit system (107), and,
   c. the control circuit system (107) having first (408) and second (409) output terminals for providing control signals to an electronic switch (401), and
   d. the electronic switch (401) connected between the input terminal (103) and bidirectional switch output terminal (104); wherein the state of the control signal appearing between control system output terminals (408, 409) determines the state of the switch.

2. The bidirectional electronic switch system of claim 1 wherein the AC to DC conversion system comprises:
   a. a voltage divider (501, 502) connected across control circuit system (107), and,
   b. a first switch (503), having an input (510) and an output (511), connected through its input (510) to the voltage divider, and,
   c. a second switch (506), having an input (512) and an output (513), whose input (512) is connected to the output (511) of the first switch (503) through a current limiting resistor (505), and,
   d. a storage capacitor (208) connected through a diode (207) to the output (513) of the second switch (506), and,
   e. a Zener diode (508), having a Zener voltage, connected between the input (512) and output (513) of the second switch (506) and a shunt capacitor (509) connected in parallel to the Zener diode (508) thereby clamping a voltage between the input (512) and the output (513) of the second switch (506) to the Zener voltage of the Zener diode (508), and,
   f. the control circuit system (107) connected to the storage capacitor (208).

3. The AC to DC conversion system of claim 2 further comprising a series voltage regulator circuit interposed between the storage capacitor (208) and the control circuit system (107), the series voltage regulator circuit comprising a pass transistor (1003) having a characteristic threshold voltage ($V_T$) connected to the control circuit system (107) and a bias resistor (1004) connected across the pass transistor, and, a Zener Diode (1005) having a Zener voltage ($V_Z$) connected to the bias resistor such that an output voltage to the control circuit system (107) is maintained at $V_Z$-$V_T$.

4. The AC to DC conversion system of claim 2 further comprising current limiting electronic circuitry interposed between the second switch (506) and the storage capacitor (208) to limit the current flowing through the second switch 506, the current limiting electronic circuitry including:
   a. a sense resistor (1002) connected between the output (513) of the second switch (506) and the control circuit system (107), and,
   b. a bipolar transistor (1001) connected between the control circuit system and the input (512) of the second switch (506).

5. The AC to DC conversion system of claim 2 wherein the first switch and the second switch are both N-MOSFETs.

6. The AC to DC conversion system of claim 2 wherein the first switch and the second switch are both bipolar transistors.

7. The AC to DC conversion system of claim 1 wherein all semiconductor devices are fabricated on a single integrated circuit chip.

8. The AC to DC conversion system of claim 2 wherein all semiconductor devices are fabricated on a single integrated circuit chip.

9. The AC to DC conversion system of claim 4 wherein all semiconductor devices are fabricated on a single integrated circuit chip.

10. The bidirectional electronic switch system of claim 1 wherein the switch control circuit (107) output signals (408, 409) are pulsed in synchronism with the AC source (101) to provide phase control of the AC power delivered to the load (102).

11. The bidirectional electronic switch system of claim 1 wherein the control circuit system (107) output signals (408, 409) comprise: a pulse train synchronized with the AC source (101), the pulse train having adjustable pulse widths to effectively control the average current/power delivered to the load (102) thereby providing a dimming effect for a light source load and a speed control for an AC motor load.

12. The bidirectional electronic switch system of claim 1 wherein the electronic switch (401) comprises:
   a. a third (301) and a fourth (302) series connected electronic switch device, each switch device having a drain terminal (309, 310), a source terminal (311, 312) and a gate terminal (313, 314) and each of the third and fourth series connected switch devices having a characteristic threshold voltage between the gate terminal (313, 314) and the source terminal (311, 312), wherein the drain terminal (309) of the third switch device (301) comprises the first input terminal of the solid state bidirectional switch (400), and drain terminal (310) of the fourth switch device (302) comprises the first output terminal of the solid state bidirectional switch (400), the source terminals (311, 312) of the first and second switch devices (301, 302) are interconnected at a first control terminal (315) and the gate terminals (313, 314) of the first and second switch devices are interconnected at a second control terminal (316).

13. The bidirectional electronic switch system of claim 12 further comprising a ballast circuit (1007) connected between the drain terminal (309) of the third switch device (301) and the input terminal (103), the ballast circuit including a fifth switch (1102) and a ballast resistor (1101), the ballast resistor and the fifth switch connected in parallel, and, the fifth switch controlled by the electronic control system (107), such that the fifth switch is closed in a first state and current through the bidirectional electronic switch system (400) to the load (102) bypasses the ballast resistor (1101) and the fifth switch is open in a second state and current through the bidirectional electronic switch system (400) to the load (102) is limited by the ballast resistor (1101).

* * * * *